United States Patent [19]

Moon

[11] Patent Number: 5,812,508
[45] Date of Patent: Sep. 22, 1998

[54] DIGITAL BIT SIGNAL DETECTION CIRCUIT FOR REPRODUCING OPTICAL DATA

[75] Inventor: Byeong Moo Moon, Seoul, Rep. of Korea

[73] Assignee: LG Electronics, Inc., Seoul, Rep. of Korea

[21] Appl. No.: 771,927

[22] Filed: Dec. 23, 1996

[30] Foreign Application Priority Data

Dec. 23, 1995 [KR] Rep. of Korea ................ 55629/1995

[51] Int. Cl.$^6$ ................................................ G11B 7/00
[52] U.S. Cl. ............................................. 369/59; 369/124
[58] Field of Search ................................. 369/32, 48, 47, 369/59, 124

[56] References Cited

U.S. PATENT DOCUMENTS

| | | | |
|---|---|---|---|
| 5,067,138 | 11/1991 | Van Rens et al. | 375/81 |
| 5,295,128 | 3/1994 | Hutchins et al. | 369/59 |
| 5,486,865 | 1/1996 | James | 398/465 |
| 5,585,975 | 12/1996 | Bliss | 360/65 |

*Primary Examiner*—Nabil Hindi

[57] ABSTRACT

A data reproducing apparatus for reproducing data from mediums such as digital compact discs, includes a discrete time oscillator for detecting a phase transmission of a reproduced digital signal, and an interpolation unit for interpolating the reproduced digital signal in accordance with a value detected in the discrete time oscillator. The apparatus may also include an adaptive equalizer for removing components which distort, or otherwise impair, data reproduction from a value output from the interpolation unit, an adder for adding a value output from the adaptive equalizer to a critical value decision level, and a phase detector for detecting the reproduced digital signal in accordance with a value output from the adder. The apparatus facilitates asymmetric compensation by interpolating a sampled RF signal in a discrete time oscillator, and by employing an adaptive equalizer.

9 Claims, 9 Drawing Sheets

$\phi a < \phi o$ $\phi o > \phi a$

DIGITAL BIT SIGNAL DETECTION CIRCUIT FOR REPRODUCING OPTICAL DATA

BACKGROUND OF THE INVENTION

1. Field of the Invention

The present invention relates to a data reproducing apparatus for a digital compact disc, and more particularly to a data reproducing apparatus for a digital compact disc capable of facilitating asymmetric compensation by interpolating a sampled RF (radio frequency) signal and equalizing the interpolated signal by employing an adaptive equalizer.

2. Description of the Prior Art

With reference to "An All-Digital Bit Detector for Compact Disc Player" published in IEEE JOURNAL ON SELECTED AREAS IN COMMUNICATIONS, VOL. 10, NO. 1, JANUARY 1992, a conventional data reproducing apparatus for a digital compact disc is shown in FIG. 1. That apparatus includes: an analog/digital converter 100 for converting an input RF signal to a digital signal; an equalizer 110 for receiving signal output from the analog/digital converter 100 and for removing components which may distort or degrade data reproduction; a subtractor 120 for subtracting a decision level DL serving as a critical value from the signal output from the equalizer 110 and then for outputting an asymmetrically compensated digital value of a compact disc; a PLL (phase-locked loop) 130 for receiving the signal output from the subtractor 120 and for adjusting the phase of a clock signal for data reproduction to the phase of a corresponding data; a runlength detector 170 for receiving the output signal from the subtractor 120 and a signal output from the digital PLL 130, and detecting a runlength; a sub-critical value detector 140 for receiving the output from the subtractor 120 and detecting a sub-critical value when reproducing data; a main critical value detector 150 for receiving a signal output from the digital PLL 130 and a runlength detecting data output from the runlength detector 170, and for detecting a main critical value; an adder 160 for adding a signal output from the main critical detector 150 and from the sub-critical value detector 140, and for outputting the critical value decision level DL; and a frequency loop 180 for receiving the signal output from the runlength detector 170 and determining an operational range of the digital PLL.

As shown in FIG. 2, the digital PLL 130 includes: a phase detector 131 for sampling a signal phase of a discrete time oscillator 133 in accordance with a signal output from the subtractor 120, and for outputting a phase error to the main critical value detector 150; a loop filter 132 for filtering a sampled signal phase of the phase detector 131 in accordance with a signal output from the frequency loop 180; and a DTO (discrete-time oscillator) 133 for outputting an oscillation data output from the loop filter 132 to the phase detector 131 and the runlength detector 170. DTO 133 may include an analog VCO (voltage controlled oscillator).

As shown in FIG. 3A, the discrete time oscillator 133 includes: an adder for adding a signal value $I_{dto}$ applied thereto from the loop filter 132 in the digital PLL 130 to a register value in accordance with a sampled frequency $T_s$; and a modular operator for carrying out a modular operation of the output value of the adder and for outputting a signal having a value $U_{dto}$.

Referring to FIG. 4, the main critical value detector 150 includes: a multiplier for multiplying a phase error received from the phase detector 131 in the digital PLL 130 with a predetermined value (e.g., ±1); an adder for adding the output of the multiplier to the value of a runlength and pit/land; and a gain converter G1 for converting the output of the adder and for applying the resultant value to the adder 160.

As shown in FIG. 5, the frequency loop 180 includes a runlength detector for detecting a runlength value applied from the runlength detector 170.

The operation of the above-described conventional data reproducing apparatus for a digital compact disc will now be described with reference to FIGS. 1–5.

First, the analog/digital converter 100 converts a RF signal read from an optical pick-up (not shown) into a digital signal and sends the converted signal to the equalizer 110. Equalizer 110 removes components of the signal resulting from defocusing, asymmetry and high density which distort data reproduction, and outputs the resultant value to the subtractor 120.

Subtractor 120 subtracts a critical value decision level DL output by the adder 160 from the signal output from the equalizer 110 to determine an appropriate critical value.

In order for a bit signal to be reproduced from a compact disc during the above data reproducing procedure, data must be recorded in a pit/land track of the disc in accordance with an EFM (eight-to-fourteen modulation) method. Here, the length of a pit is confined from 3T to 11T, wherein T denotes a cycle of a bit clock signal.

A pit of a compact disc which is shorter than a desired length results in a larger reflection rate for a disc track, causing an increase in a critical value decision level DL.

To determine an appropriate decision level DL of a critical value by compensating asymmetrically during a disc fabrication, as shown in FIG. 4, the main critical value detector 150 utilizes a phase error and a runlength detected by runlength detector 120 and confined in accordance with an EFM, which ranges from 3T to 11T. Also, the sub-critical value detector 140 employs an asymmetrically compensated value, which is obtained by subtracting a critical value decision level DL from the output value of the equalizer 110.

The phase detector 131 samples the signal phase of the output from discrete time oscillator 133 at a zero crossing of the input signal IN, and the discrete time oscillator 133, as shown in FIG. 3, converts the frequency and phase of the output digital value $U_{dto}$ in accordance with the magnitude of the digital value $I_{dto}$ applied from the loop filter 132.

As shown in FIGS. 6A–6B, the runlength detector 170 receives a signal output from the discrete time oscillator 133 in the digital PLL 130 and, when the phase of the input signal reaches a certain level, a runlength is detected by determining "1" or "0" in accordance with the magnitude of the output signal of the subtractor 120.

Referring to FIG. 5, the frequency loop 180 receives a runlength output from the variable length detector 170. Frequency loop 180 is operated when the input runlength exceeds the detection range of the phase detector 131 included in the digital PLL 130, effectively fitting the frequency of the discrete time oscillator 133 to a detection range of the phase detector 131. Here, the detection of the phase detector 131 ranges from 3T to 11T as prescribed in the EFM.

However, when the conventional data reproducing apparatus for a digital compact disc operates as described above, it equalizes an RF signal sampled in a certain interval so that a fixed equalizer should be employed. Because an asymmetric compensation uses a signal output from the equalizer, a phase error must be employed to precisely compensate asymmetry, thereby complicating the related procedures.

SUMMARY OF THE INVENTION

It is an object of the present invention to provide a data reproducing apparatus for a digital compact disc which facilitates asymmetric compensation by interpolating a sampled RF signal in a discrete time oscillator and which employs an adaptive equalizer for equalizing the interpolated signal.

To achieve the above-described object, the improved data reproducing apparatus, which may read from a digital compact disc, according to the present invention may include an analog/digital converter for converting a RF signal to a digital signal, a discrete time oscillator for outputting an oscillating signal in accordance with an input signal, and a main/sub-critical value detector for generating a critical decision level. The apparatus may also include an interpolation unit for receiving an output from the analog/digital converter and interpolating at a first order, an input signal when an output phase of a discrete time oscillator is set to "0", an adaptive equalizer for receiving an output of the interpolation unit and removing components distorting or otherwise impairing data reproduction, a subtractor for subtracting a critical value decision level from an output of the adaptive equalizer and for outputting an asymmetrically compensated digital signal, a phase detector for detecting a phase difference between a phase of the asymmetrically compensated digital output signal from the subtractor and phase of the oscillating signal from the discrete time oscillator, and for outputting detection data in accordance with the asymmetrically compensated digital output signal; a frequency detector for detecting a frequency difference in accordance with a runlength of the detection data from the phase detector, an adder for adding a frequency difference detected in the frequency detector to a phase difference detected in the phase detector, and a loop filter for filtering an output of the adder and generating a signal having a frequency property of a DPLL (digital phase-locked loop).

DETAILED DESCRIPTION OF THE PRESENT INVENTION

Figure 1:
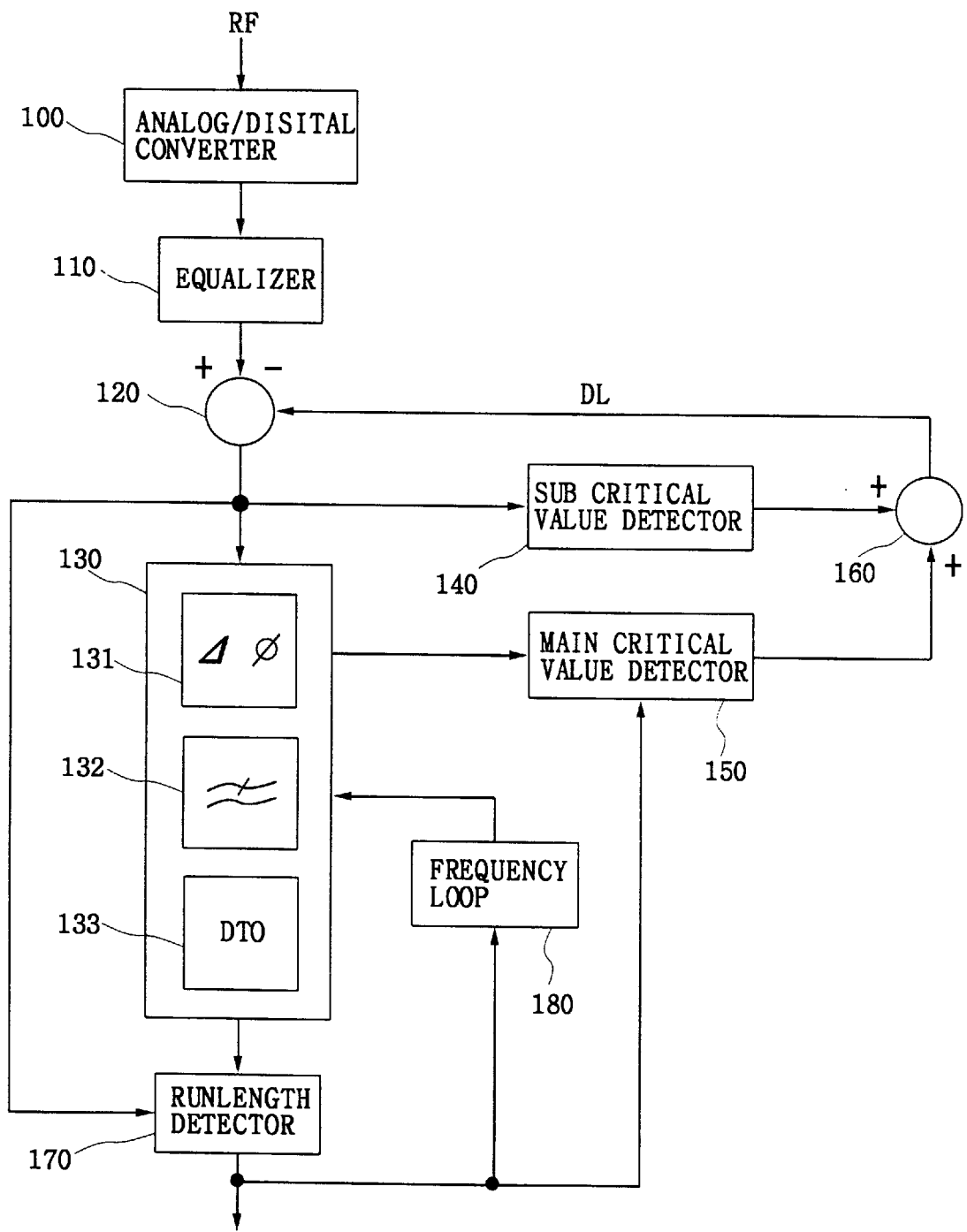
FIG. 1 is a block diagram of a conventional data reproducing apparatus for a digital compact disc.
Figure 2:
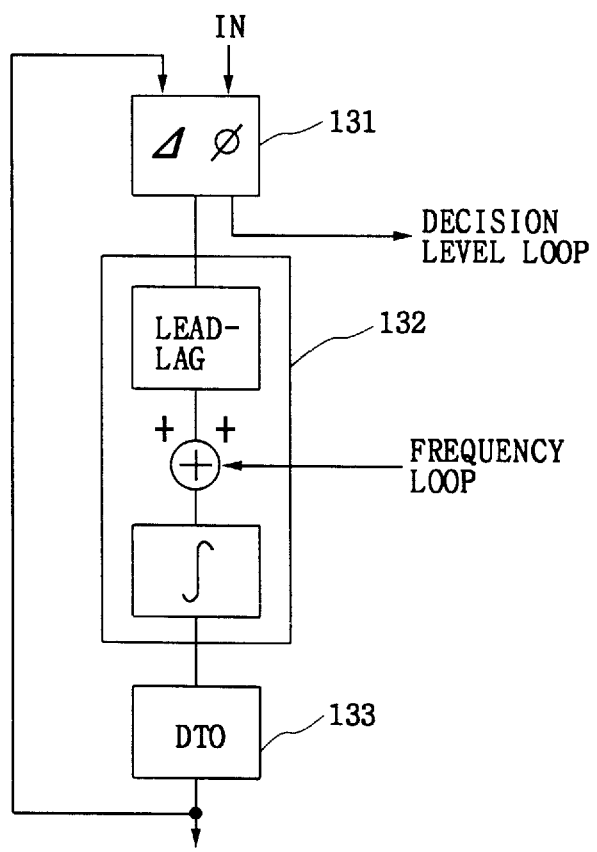
FIG. 2 is a detailed block diagram of a digital PLL in FIG. 1.
Figure 3A:
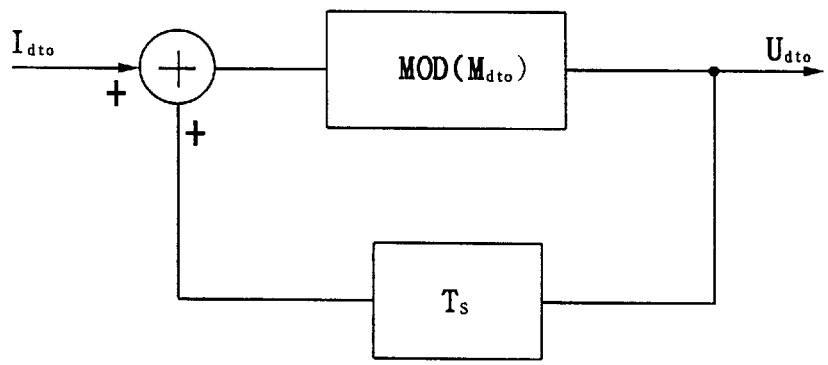
FIG. 3A is a detailed block diagram of a discrete time oscillator in FIG. 2.
Figure 3B:
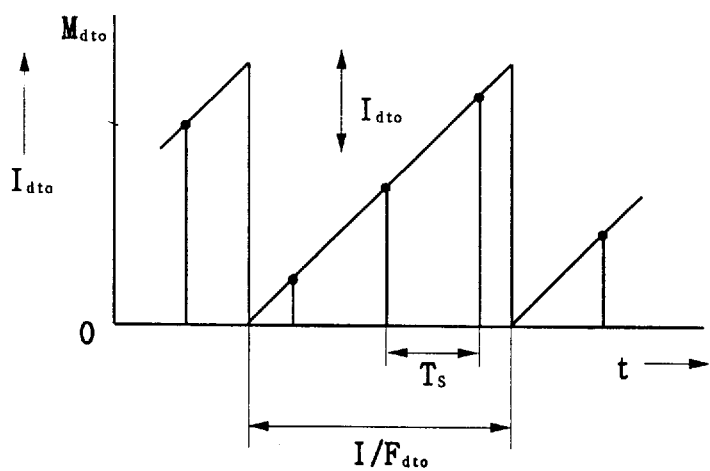
FIG. 3B is a graph showing the operation of the discrete time oscillator in FIG. 2.
Figure 4:
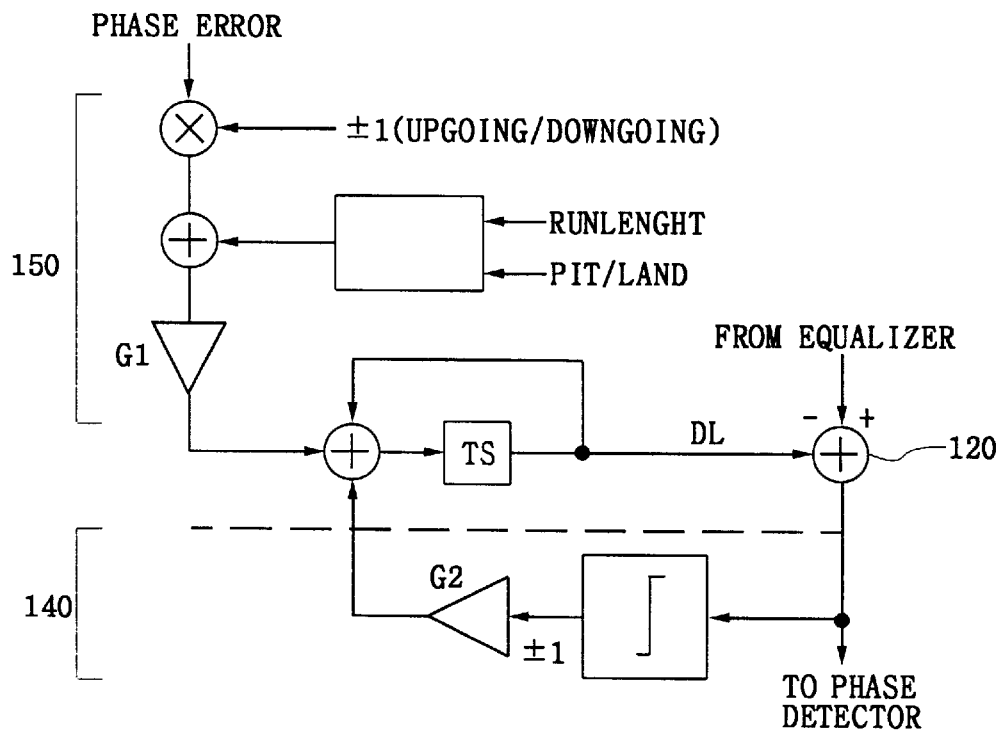
FIG. 4 is a detailed block diagram showing a sub- and a main critical value detector in FIG. 1.
Figure 5:
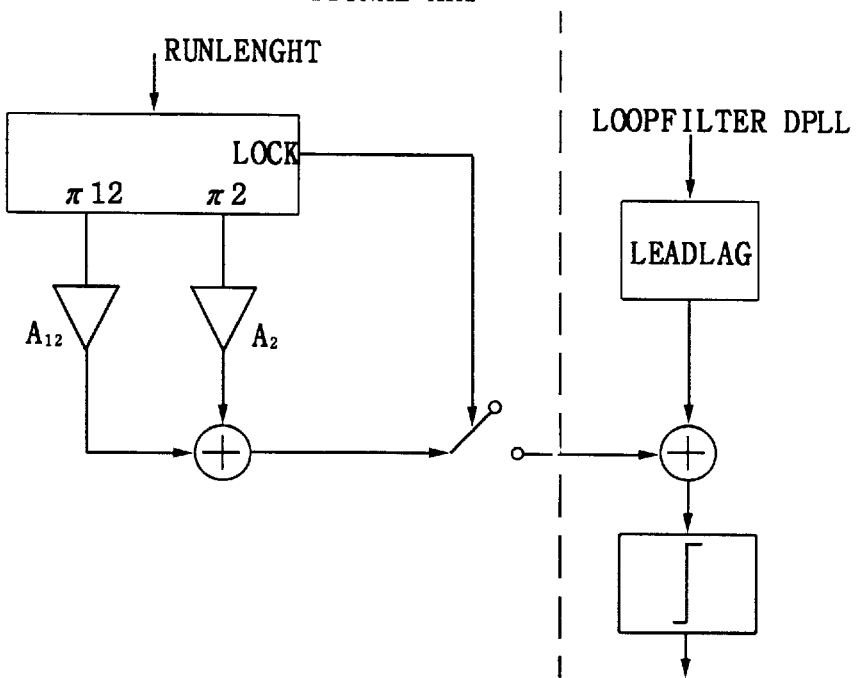
FIG. 5 is a detailed block diagram showing a frequency loop in FIG. 1.
Figure 6A:
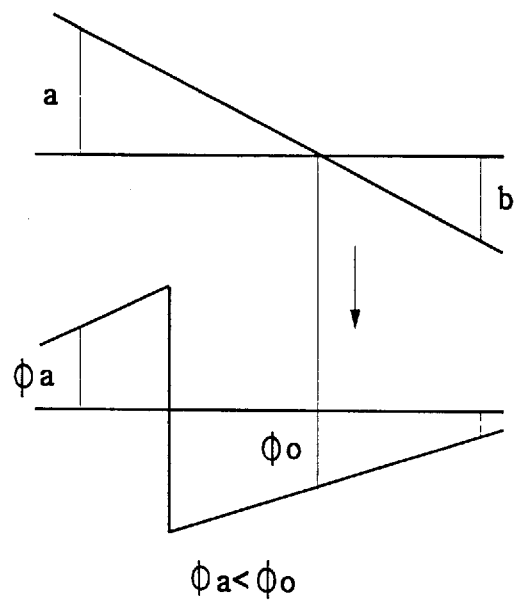
FIGS. 6A and 6B are graphs showing the operation of a variable length detector in FIG. 1.
Figure 6B:
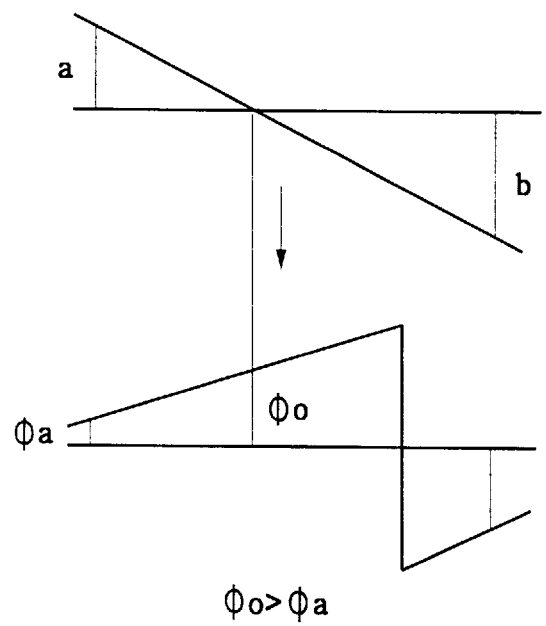
Figure 7:
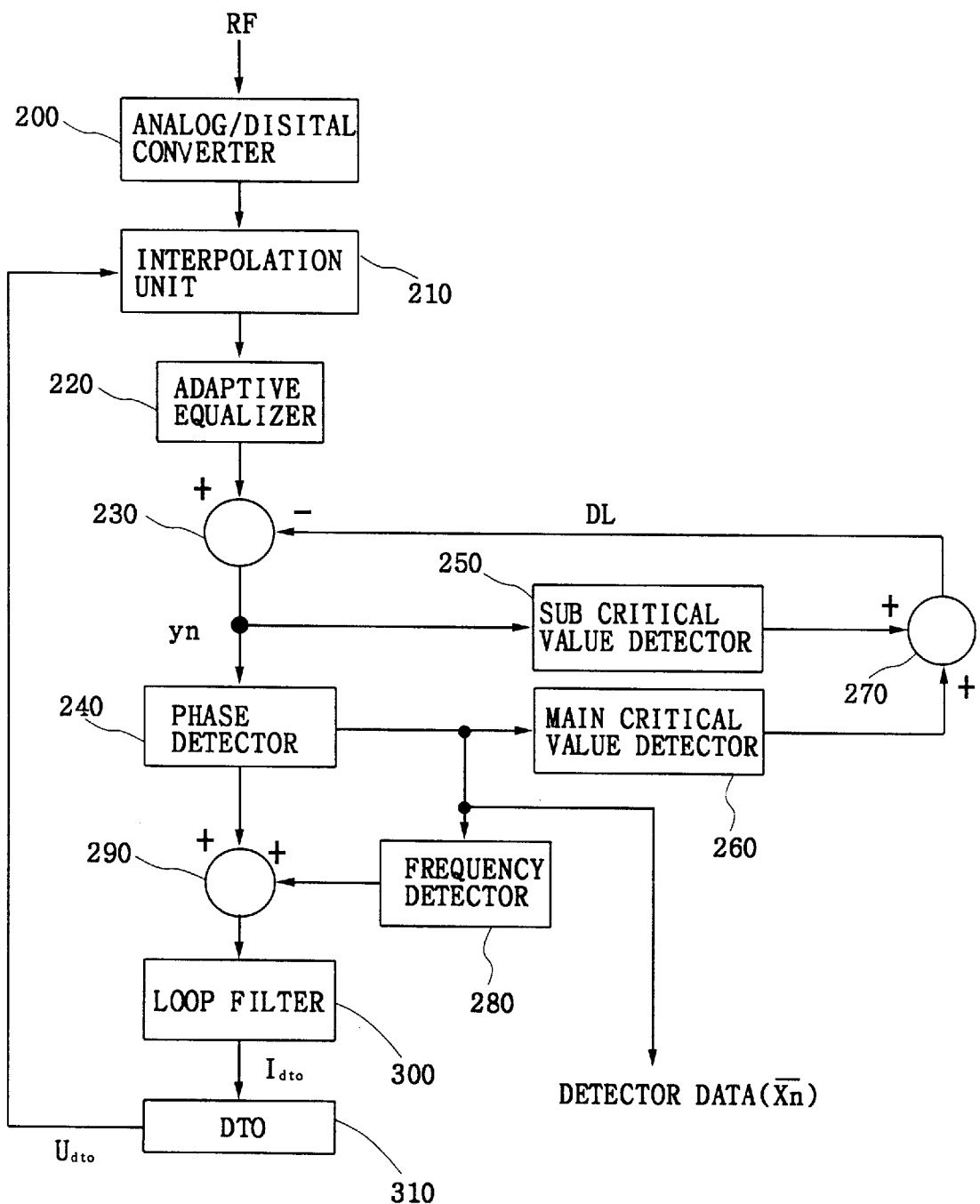
FIG. 7 is a block diagram of a data reproducing apparatus for a digital compact disc according to the present invention.

As shown in FIG. 7, the data reproducing apparatus for a digital compact disc includes: an analog/digital converter 200 for converting an input RF signal to a digital signal; an interpolation unit 210 for receiving a signal output from the analog/digital converter 200 and for interpolating an input signal at a first-order when an output signal phase of a discrete time oscillator 310 is set "0"; an adaptive equalizer 220 for receiving an output from the interpolation unit 210 and for removing components distorting or degrading data reproduction; a subtractor 230 for subtracting a critical value decision level DL from a signal output from the adaptive equalizer 220 and for outputting an asymmetrically compensated digital signal yn from the disc; a phase detector 240 for obtaining a phase difference between the phase of digital signal yn output from the subtractor 230, for selecting a predetermined gain and for detecting a sub-critical value in a data reproducing mode; a main critical value detector 240 for detecting a main critical value by selecting a predetermined gain; an adder 270 for adding respective values output from the main critical value detector 260 and the sub-critical value detector 250 and for applying the critical value decision level to the subtractor 230; a frequency detector 280 for detecting a frequency difference in accordance with a runlength of the signal /xn detected in the phase detector 240; an adder 290 for adding the frequency difference detected in the frequency detector 280 to the phase difference detected in the phase detector 240; a loop filter 300 for filtering an output of the adder 290 and for generating a signal $I_{dto}$ having a frequency property of a DPLL (digital phase-locked loop); the discrete time oscillator (DTO) 310 for converting a frequency and a phase that are proportional to the output value of the loop filter 300 and for applying the frequency and phase to interpolation unit 210.

Figure 8:
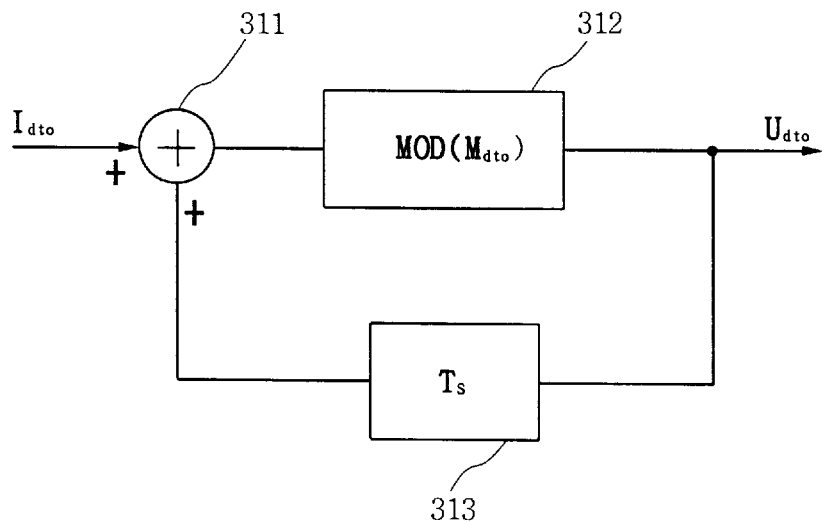
FIG. 8 is a detailed block diagram of a discrete time oscillator in FIG. 7.
Figure 11:
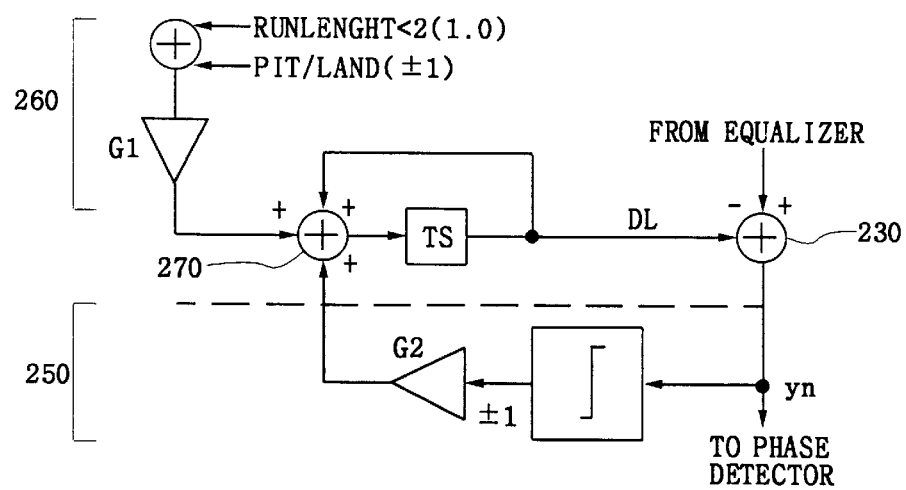
FIG. 11 is a detailed view of a main and a sub-critical value detector in FIG. 7.

As shown in FIG. 8, the discrete time oscillator 310 includes an adder 311, a modular operator 312 and a register 313 having a sampled clock signal cycle Ts. The main critical value detector 260 and the sub-critical value detector 250 are composed as shown in FIG. 11.

The operation and effects of the above-described data reproducing apparatus, with particular reference to a compact disc application, will now be described according to the present invention.

First, the analog/digital converter 200 samples a RF signal read from the disc using an optical pick-up, and converts the RF signal to a digital signal. The converted signal is output to the interpolation unit 210, which interpolates the applied digital signal in accordance with the signal phase of the discrete time oscillator 310. Further detail will be described with reference to FIGS. 10A and 10B.

The analog/digital converter 200 samples an input signal RF at a clock cycle Ts, and outputs digital values a, b to an interpolation unit 210.

As shown in FIG. 8, the discrete oscillator 310 adds an input digital value $I_{dto}$ to a digital value stored in the register 313 at every clock signal cycle, and performs a modular operation in accordance with a signal value $M_{dto}$. The resultant value $U_{dto}$ is stored in the register 313 and then applied to the interpolation unit 210.

Figure 9:
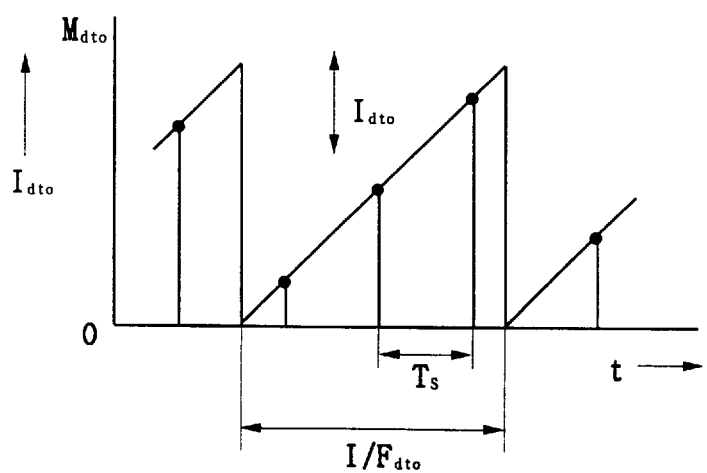
FIG. 9 is a graph showing operation of a discrete time oscillator in FIG. 7.

Therefore, as shown in FIG. 9, the output value $U_{dto}$ of the discrete time oscillator 310 has a slope which is variable depending on an input digital value $I_{dto}$. For that reason, the frequency and the phase of the output value $U_{dto}$ are changed.

Figure 10:
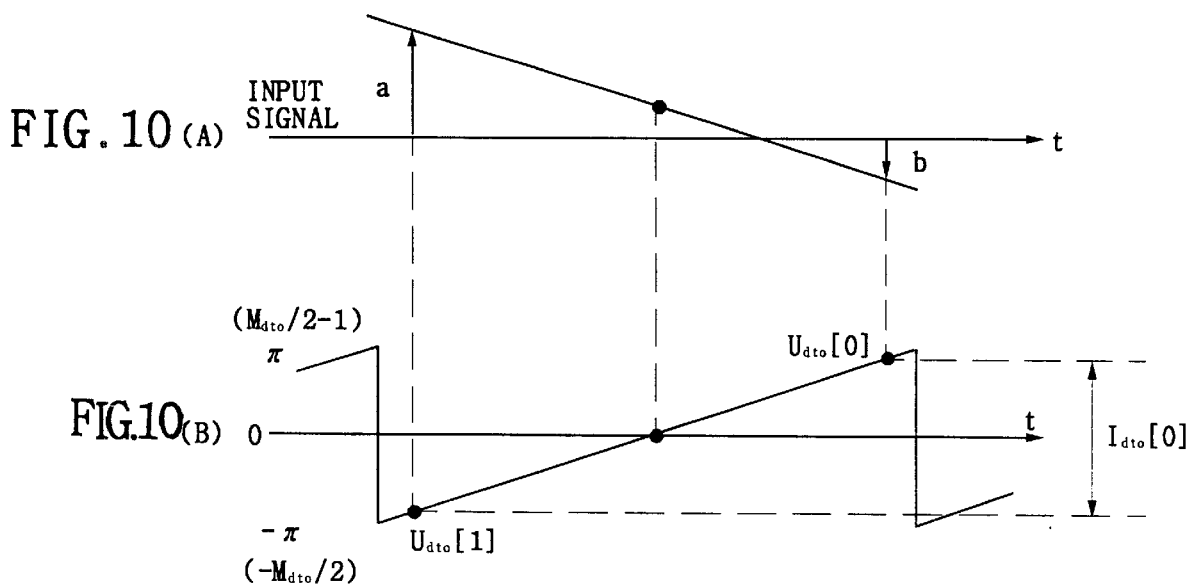
FIGS. 10A and 10B are graphs showing operation of an interpolation unit in FIG. 7.

As shown in FIG. 10B, the interpolation unit 210 obtains an interpolated value rf by interpolating the input digital values a,b at every bit clock signal which corresponds to a phase value "0" of the discrete time oscillator 310. Here, the interpolated value rf is defined in expression (1) as follows.

$$rf = a + (a - b) \times \frac{U_{dto}[1]}{I_{dto}[0]} \quad (1)$$

Consequently, the interpolation unit 210 interpolates a sampled digital signal in a first-order based on a bit clock signal synchronized to data written on the disc at every clock signal cycle Ts.

The adaptive equalizer 220 equalizes a digital signal interpolated by the interpolation unit 210, effectively removing encoded interference due to a high density and a transformed signal due to a defocusing. The digital signal output by equalizer 220 is applied to the subtractor 230. The subtractor 230 subtracts a critical value decision level DL determined by the sub-critical value detector 250 and the main critical value detector 260 from a digital output signal of the adaptive equalizer 220, effectively compensating asymmetry which occurred during a disc fabrication.

The phase detector 240 receives a compensated asymmetric digital signal yn output from the subtractor 230, obtains a phase difference between the phase of a signal output from the discrete time oscillator 310 and a signal read from the disc, detects whether the signal read from the disc is "0" or "1", and simultaneously outputs the detected data signal /xn to the frequency detector 280 and to an external device as reproduced digital data.

Figure 12:
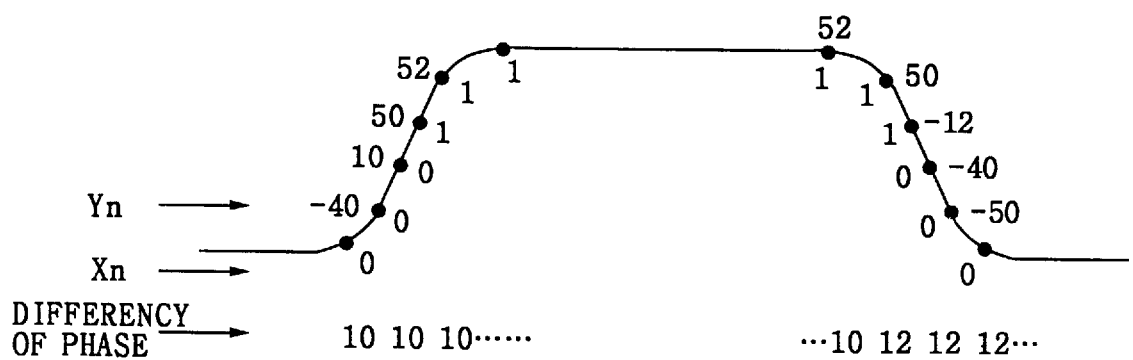
FIG. 12 is a view showing operation of a phase detector in FIG. 7.

With reference to FIG. 12, expression (2), shown below, is used by the phase detector 240 to determine whether a data signal /xn is "1" or "0", based on a signal yn outputted from the subtractor 230.

If $(yn+yn-1) \geq "0"$, then $/xn = "1"$, otherwise $/xn = "0"$,
(n=1,2 ... ) (2)

Expression (3) shown below is used to determine a phase difference with respect to input signal yn; the determined phase difference is applied to the adder 290:

If $(/xn+/xn-1) = "1"$ and $/xn = "1"$, then a phase difference$=yn-1$,
whereas if $(/xn+/xn-1) = "1"$ and $/xn \neq "1"$, then a phase difference$=-yn-1$ (3)

Here, if $(/xn+/xn-1) = "0"$, a previously determined phase difference is maintained.

The sub-critical value detector 250 shown in FIG. 11 selects a gain value G2 if the asymmetrically compensated output signal of the subtractor 230 is larger than "0". By contrast, sub-critical value detector 250 selects a reversed gain value −G2 if the asymmetrically compensated output signal of the subtractor 230 is less than "0". The sub-critical value generated is output to the adder 270.

The multiplier included in the main critical detector 260 multiplies "±1" with a runlength value which denotes a consecutive length of "1" or "0" for detection data /xn output from the phase detector 230. The multiplier is output in accordance with the detection data /xn of "1" or "0", that is, in accordance with a pit signal and a land signal. Accordingly, the main critical detector 260 selects a gain value −G1 if a runlength of the detection data /xn is less than "2" and the detection data /xn is equal to "1". By contrast, a gain value G1 is selected if the runlength of the detection data /xn is less than "2" and the detection data /xn is equal to "1". The main critical value is output to the adder 270.

Accordingly, the adder 270 adds the output values of the sub-critical detector 250 and the main critical value detector 260. An output signal from adder 270 is applied to the subtractor 230.

The frequency detector 280 detects a frequency difference in accordance with a runlength of the detection data output from the phase detector 240 and applies the same to the adder 290.

The adder 290 adds the phase difference value output from the phase detector 240 to the phase difference value output form the frequency detector 280. The resultant value is output to the loop filter 300 which filters the output value of the adder 290, and applies a signal $I_{dto}$ having a DPLL frequency property to the discrete time oscillator 310. The loop filter 300 in general has a low pass filtering property.

As described above, when a phase transmission occurs with regard to the output value of the discrete time oscillator, the present invention interpolates an RF signal sampled at a certain interval and achieves asymmetric compensation.

What is claimed is:

1. A digital bit signal detection circuit for reproducing optical data, comprising:
   a discrete time oscillator for detecting a phase transmission of a reproduced digital signal;
   an interpolation unit for interpolating the reproduced digital signal in accordance with a value detected by the discrete time oscillator;
   an equalizer for equalizing an amplitude of the reproduced digital signal output from the interpolation unit;
   an adder for adding a value output from the equalizer to a critical value decision level; and
   a phase detector for detecting the reproduced digital signal in accordance with a value output from the adder.

2. A digital bit signal detection circuit for reproducing optical data including an analog/digital converter for converting a RF signal to a signal to a digital signal, a discrete time oscillator for outputting an oscillating signal in accordance with an input signal, and a main and a sub-critical value detector for generating a critical value decision level, comprising:
   an interpolation unit for receiving the digital signal output from the analog/digital converter and for interpolating the digital signal at a first order when an output phase of a discrete time oscillator is set to "0";
   an equalizer for equalizing an amplitude of the signal output from the interpolation unit;
   a subtractor for subtracting a critical value decision level from a signal value output from the equalizer to generate an asymmetrically compensated digital output signal;
   a phase detector for detecting a phase difference between a phase of the asymmetrically compensated digital output signal from the subtractor and a phase of the oscillating signal from the discrete time oscillator, and for outputting detection data in accordance with the asymmetrically compensated digital output signal;
   a frequency detector for detecting a frequency difference in accordance with a runlength of the detection data from the phase detector;
   an adder for adding a frequency difference detected in the frequency detector to the phase difference detected in the phase detector; and a loop filter for filtering a signal output from the adder and generating a signal having a frequency property of a DPLL (digital phase-locked loop).

3. The circuit of claim 2, wherein the main critical value detector comprises a multiplier for multiplying the runlength denoting a length of the detected data from the phase detector with a value that is predetermined in accordance with the detected data.

4. The circuit of claim 2, wherein the phase detector generates, in accordance with the asymmetrically compensated digital signal, the detection data which is equal to "1", if $(y_n+y_{n-1}) \geq$ "0", and otherwise generates the detection data $/x_n$ which is equal to "1", for values of n which are positive integers.

5. The circuit of claim 2, wherein the phase detector maintains, in accordance with the asymmetrically compensated digital signal the detection data, a phase difference $(=y_{n-1})$ if $(/x_n \oplus /x_{n-1})=$"1", and a previously determined phase difference if $(/x_n \oplus /x_{n-1})=$"0", for values of n which are positive integers.

6. The digital bit signal detection circuit recited by claim 1, wherein said reproduced digital signal represents data reproduced from a digital compact disk.

7. The data reproducing apparatus of claim 1, wherein said equalizer is an adaptive equalizer for reducing distorted components of said reproduced digital signal output from said interpolation unit.

8. The digital bit signal detection circuit recited by claim 2, wherein said reproduced digital signal represents data reproduced from a digital compact disk.

9. The data reproducing apparatus of claim 2, wherein said equalizer is an adaptive equalizer for reducing distorted components of said reproduced digital signal output from said interpolation unit.

* * * * *